United States Patent
Saric et al.

(10) Patent No.: US 11,228,318 B1
(45) Date of Patent: Jan. 18, 2022

(54) BANDWIDTH ADJUSTABILITY IN AN FMCW PLL SYSTEM

(71) Applicant: NXP B.V., Eindhoven (NL)

(72) Inventors: Tarik Saric, Eindhoven (NL); Piotr Gibas, Eindhoven (NL); Zhirui Zong, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/083,968

(22) Filed: Oct. 29, 2020

(51) Int. Cl.
  *H03L 7/107* (2006.01)
  *H03L 7/093* (2006.01)
  *H03L 7/099* (2006.01)
  *H03L 7/089* (2006.01)

(52) U.S. Cl.
  CPC .......... *H03L 7/093* (2013.01); *H03L 7/0895* (2013.01); *H03L 7/0992* (2013.01); *H03L 7/107* (2013.01)

(58) Field of Classification Search
  CPC ....... H03L 7/093; H03L 7/107; H03L 7/1075; H03L 7/0895; H03L 7/0992; H03L 7/193
  See application file for complete search history.

(56) References Cited

U.S. PATENT DOCUMENTS

| | | | |
|---|---|---|---|
| 7,436,228 B1 * | 10/2008 | Hoang | H03L 7/087 327/152 |
| 10,284,209 B2 * | 5/2019 | Saric | H03L 7/095 |
| 10,340,926 B2 | 7/2019 | Chillara et al. | |
| 10,439,555 B2 * | 10/2019 | Saric | H03B 5/1243 |
| 2018/0267159 A1 | 9/2018 | Wada et al. | |
| 2019/0377076 A1 | 12/2019 | Vigier et al. | |

* cited by examiner

*Primary Examiner* — Hai L Nguyen

(57) ABSTRACT

Exemplary aspects of the present disclosure involve a system and related method of PLL circuitry in a chirp signaling FMCW system having a variable PLL bandwidth (BW). To adjust the BW, the PLL circuitry may provide for variable capacitance in the circuitry. This capacitance change may allow for a bandwidth for one slope, as used for the acquisition period. The capacitance may then be adjusted to allow for a different bandwidth for another slope which is used to reset the circuitry in preparation for another frequency sweep. Adjusting the PLL BW, via variable capacitance, may be used to mitigate phase noise which can adversely the PLL.

20 Claims, 5 Drawing Sheets

US 11,228,318 B1

BANDWIDTH ADJUSTABILITY IN AN FMCW PLL SYSTEM

OVERVIEW

Aspects of various embodiments are directed to a system and related method for signal generation circuits providing FMCW (frequency modulated continuous wave) signaling in the form of frequency sweeps (chirps) and to phase lock loop (PLL) circuits having a variable PLL bandwidth (BW). The variable BW being provided, in part, by variable capacitance circuitry in the low-pass filter (LPF) circuitry. The BW may be adjusted for PLL acquisition periods and adjusted again for periods between acquisition periods.

In PLL closed loop modulation, the division ratio is adopted to achieve frequency chirps with a certain frequency bandwidth (FMCW signal). A frequency chirp has a defined rise and fall time, often called acquisition time and reset time. Acquisition time is the portion of the chirp that contains information desired for radar systems. Chirp reset does not contain any information as the receiver processes only the acquisition time region. Still, chirp reset forms an important function of resetting the chirp to its start point as fast as possible. The chirp reset slope may be much steeper (e.g., by at least 5%-10%) than the chirp acquisition slope. This steep reset slope may determine the PLL bandwidth settings, as a steeper reset slope requires a higher PLL bandwidth. A higher PLL bandwidth will also result in higher phase noise in the acquisition period, which is not desired for radar systems. It would be desirable to have a narrow bandwidth during the acquisition period to limit phase noise, and a wider bandwidth during the reset period so as to be as short as possible in order to reduce the chirp period, which effectively results in better dynamic range of radar system and lower power consumption (short data post processing).

These and other matters have presented challenges to efficiencies of FMCW PLL implementations, for a variety of applications.

SUMMARY

Various example embodiments are directed to issues such as those addressed above and/or others which may become apparent from the following disclosure concerning dynamic adjustment of the PLL BW of an FMCW system, signaling with chirps, so as to reduce phase noise and lessen reset time. Various elements/techniques may be used to accomplish dynamic adjustment such as switchable capacitor banks in the low pass filter (LPF) circuitry, a digital and analog converter (DAC) for current injection to the LPF capacitors for pre-charging filter capacitance provided by the LPF capacitors, and multiple slices for the charge pump (CP) circuitry. Control and timing for the system comes from a chirp timing engine (e.g., block 250 of FIG. 2A).

In certain other example embodiments, aspects of the present disclosure involve a system and related method of PLL circuitry in a FMCW radar system having a variable PLL bandwidth (BW). To adjust the BW, the PLL circuitry may provide for variable capacitance in the circuitry. This capacitance change may allow for a bandwidth for at least one slope, as used for the acquisition period. The capacitance may also be adjusted to allow for a different bandwidth for another slope or set of slopes which is used to reset the circuitry in preparation for another frequency sweep. In circuit more specific examples, adjusting the PLL BW, via variable capacitance, may be used to mitigate phase noise, during the acquisition period, which may adversely affect the PLL.

In other specific example embodiments, such an FMCW PLL system may also include at least one DAC configured to inject current of one polarity, into the LPF (e.g., to precharge the capacitance provided by the LPF) to assist in the chirping ramp. The DAC may also be configured to inject current of an opposite polarity to assist in decreasing the reset time of the chirp-timing circuitry. A benefit of the injection current is that current is delivered that should correspond to chirp slope and it may result in a reduction of settling time. Injection current may be active during full acquisition region, and any deviation in linearity will be compensated by the CP. This will also allow use of low PLL bandwidth which effectively results in better phase noise.

In another specific example, a PLL system may include a CP and chirp-timing circuitry to provide timing-related control signals. Further, the system may include at least one LPF circuit which may include one or more capacitors to be switched to allow decreasing and/or increasing BW of the LPF circuit. Switching of capacitors may be controlled via timing-related control signals. Also, to reduce the reset time interval, the CP may inject current, at reset time, into one or more capacitors associated with the LPF. As a specific example implementation, such timing circuitry may detect when charge pump current changes polarity, and at that moment or in response thereto, the current injection for the capacitance of the LPF may be enabled and switching of the variable capacitance (as provided by the one or more capacitors) may be enabled.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
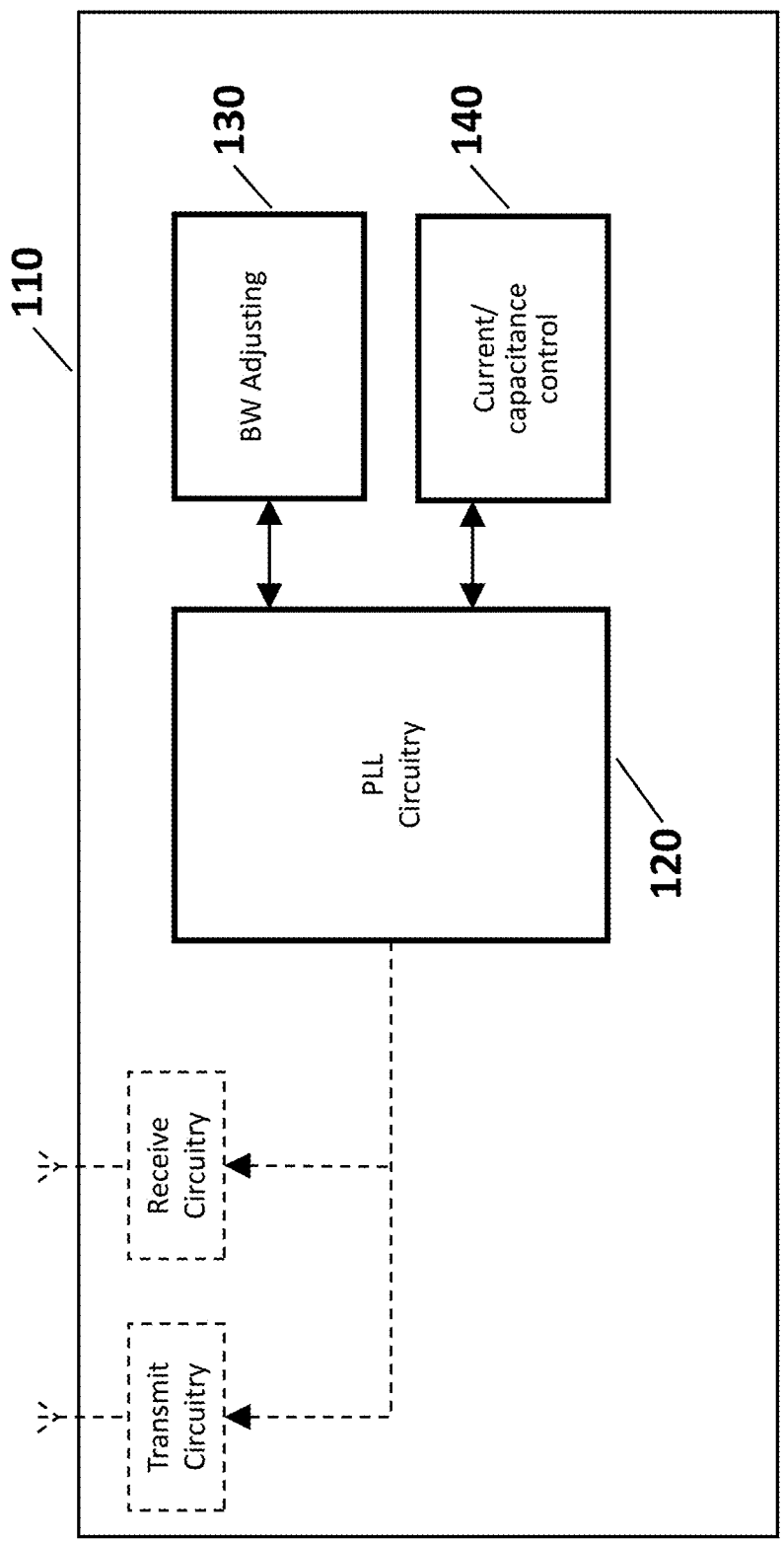
FIG. 1 is a system-level diagram illustrating an example of PLL circuitry used to generate frequency sweeps (chirps) in a FMCW radar system, in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving radar systems using FMCW (frequency modulated continuous wave) signaling in the form of frequency sweeps (chirps).

In certain implementations, aspects of the present disclosure have been shown to be beneficial when used in the context of radar systems used in automotive cruise controls and anti-collision systems. In some specific embodiments, radar systems may include FMCW chirp signaling with PLL (phase-lock loop) circuitry to assist in generating the chirp signaling. In such a system, the frequency sweep may include an acquisition portion of the sweep (the portion that will be used to extract information about distance, speed and acceleration) and then a reset portion to reset the circuitry to return to the start of the next frequency sweep. As the reset and acquisition may be have different requirements for bandwidth (BW), certain specific aspects of the present disclosure are directed to allowing for PLL bandwidth adjustment depending on a portion or various portions of the signaling. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

In specific examples according to the present disclosure, embodiments involve a system which may include signal generation circuitry to provide FMCW chirp signaling. This chirp signaling circuitry may include PLL circuitry which may have a variable or adjustable BW. To adjust the BW, the PLL circuitry may provide for variable capacitance in the circuitry. This capacitance change may allow for a bandwidth for one slope, as used for the acquisition period. The capacitance may then be adjusted to allow for a different bandwidth for another slope which is used to reset the circuitry in preparation for another frequency sweep. Adjusting the PLL BW, via variable capacitance, may be used to mitigate phase noise which may adversely affect the PLL.

In another specific example, the PLL circuitry may include a charge pump. The charge pump may apply current to the PLL capacitive circuitry during the PLL acquisition period. The charge pump current controls the slope of the chirp signal.

In yet another specific example, aspects of the present disclosure involve use of variable capacitance in the PLL circuitry being reduced during PLL reset time in preparation for another PLL acquisition period.

Turning now to the drawing and relating to or building on the above aspects and embodiments, FIG. 1 illustrates an example transceiver circuitry of a frequency-modulated continuous wave (FMCW) radar system 110 used to transmit chirp signals and to receive and process reflections in response to the FMCW transmitted signal. The system may include PLL circuitry 120 used to generate a chip signal which may consist of at least an acquisition portion and a reset portion. In the reset phase, a wide BW is sought so as to allow for a fast reset. Ideally, a chirp reset time is to be minimized in order to reduce the chirp period, which effectively results in improved/optimized dynamic range of the radar system and lower power consumption (e.g., due to short post processing of the data). When operating in the acquisition phase, having a narrower BW may reduce phase noise.

According to the present disclosure, such bandwidth control may be accomplished using various exemplary methods according to the present disclosure. In one such method, the BW adjusting circuitry 130 may be used to dynamically adjust the PLL capacitance circuitry and thereby permitting a narrowing of the PLL BW during a PLL acquisition time while mitigating noise. Block 130 may also dynamically adjust PLL circuitry 120, to permit a widening of the PLL bandwidth during a reset period, by changing the variable capacitance of the PLL capacitive circuitry.

In a second such method, block 130 may also be used to perform current injection, with a plus or minus polarity, into the PLL capacitor circuitry and thereby control the slope of the signal. This approach may be used to control the slope of the signal during acquisition time, by injecting current of one polarity. Similarly, the opposite polarity current injection may be used to increase the slope of the reset portion of the signal, thereby decreasing the reset time.

Again referring to FIG. 1, a current/capacitance control block 140 may be used to control timing of various circuits in the PLL system. This includes but is not limited to both variable capacitance and current injection for BW adjustability.

Figure 2A:
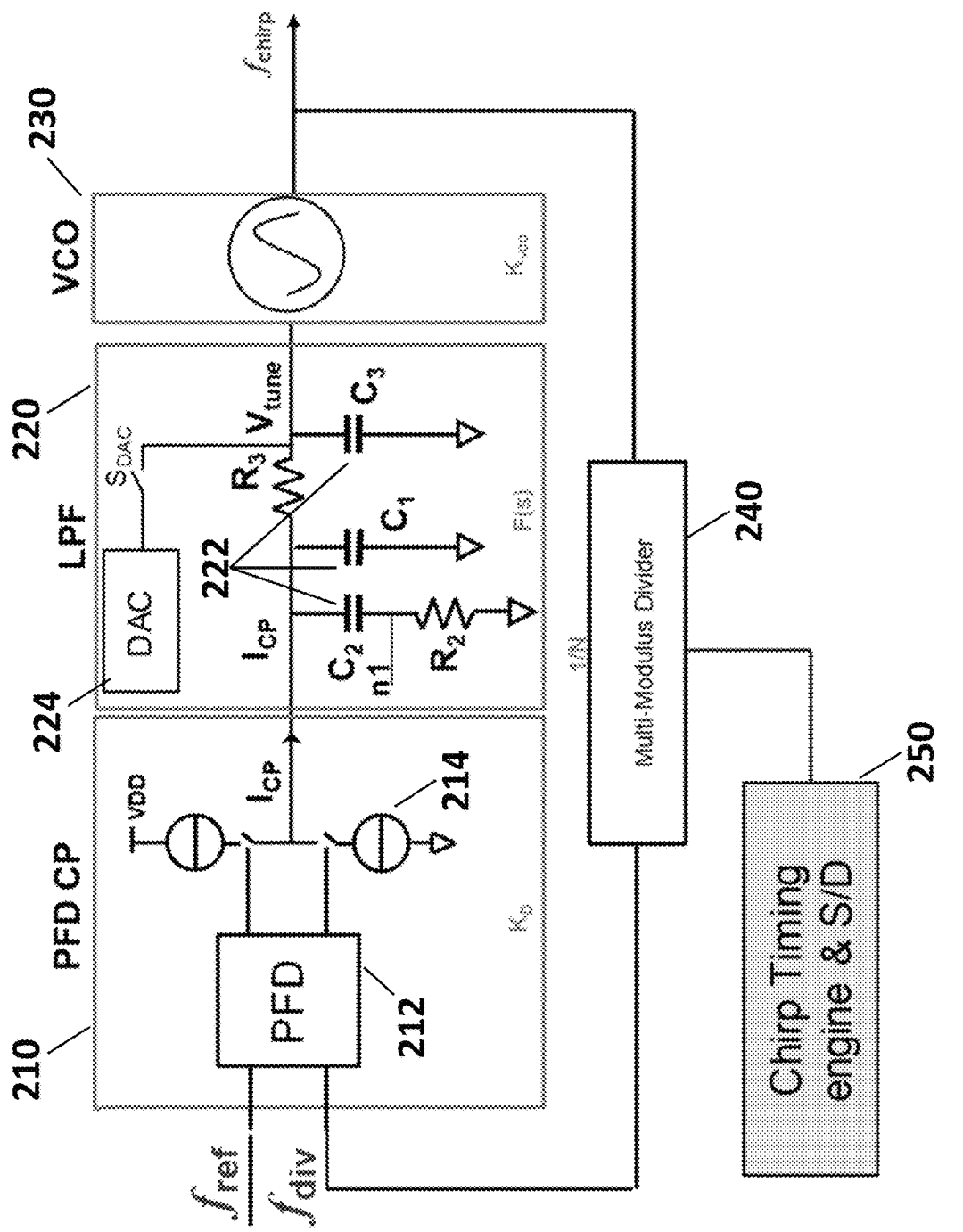
FIG. 2A is a circuit-based block diagram illustrating an example of PLL circuitry, in accordance with the present disclosure.

FIG. 2A is a more detailed block diagram of an example PLL circuitry which may be used in a system 110 such as shown in FIG. 1. In FIG. 2A, a frequency/phase reference signal ($f_{ref}$) is applied to a PFD CP (phase/frequency detector and charge pump) block 210. The PFD 212 compares a generated feedback signal with the reference frequency/phase signal ($f_{ref}$) and, as a result, generates signals to control the CP 214. The CP is capable of generating a current in either positive or negative polarity, based on control signals coming from the PFD 212. The CP 214 output current may be used for controlling the charge in the LPF (low-pass filter) 220 capacitors 222. The LPF capacitors 222 may be charged or discharged, as needed to generate the desired rising and falling ramps in a chirp signal. Also, within the LPF 220 is a DAC (digital-to-analog converter) 224 to inject current into the filter capacitor. The VCO (voltage-controlled oscillator) 230 is controlled by the LPF output ($V_{tune}$) and generates a signal at a frequency and phase as directed by $V_{tune}$. The output of the VCO 230 is the desired signal to be used in further circuitry of the FMCW radar system. The VCO 230 output is fed to a Multi-Modulus Divider 240 which divides the VCO signal output frequency in a ratio of the VCO desired frequency to the reference frequency input to the PFD CP 210. Timing various circuits for the PLL system may be controlled by the chirp timing engine 250.

Figure 2B:
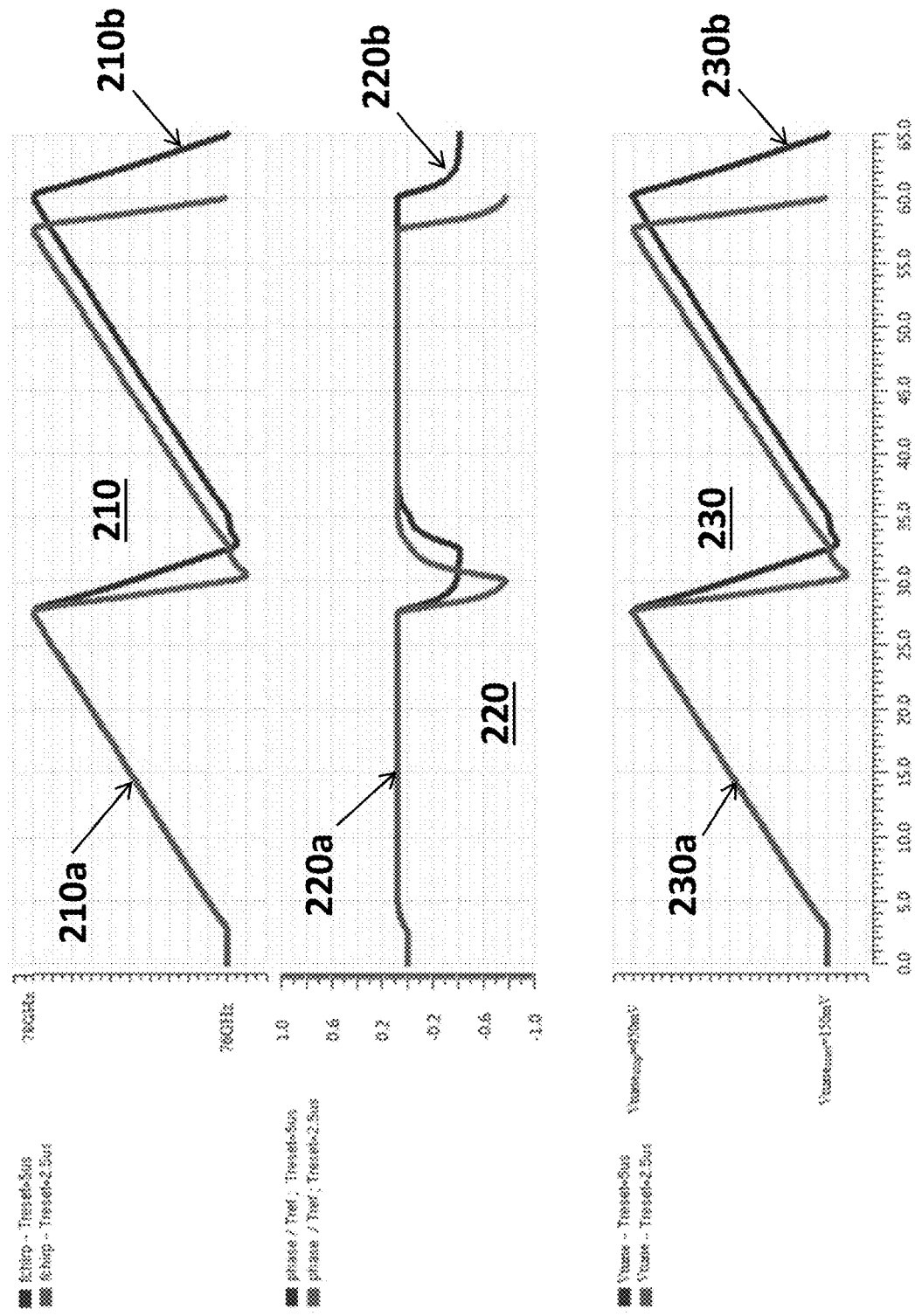
FIG. 2B is set of graphs illustrating operating parameters versus time of PLL circuitry, in accordance with the present disclosure.

FIG. 2B illustrates respective graphs showing chirp frequency ($f_{chip}$) versus time, the phase of the chirp signal versus time, and $V_{tune}$ versus time for the example PLL circuitry as illustrated in FIG. 2A. Graphs are shown for two reset times (5 microseconds as at 210a, 220a and 230a, and 2.5 microseconds reset times as at 210b, 220b and 230b). In this closed loop chirp generation system, the reset slope determines the phase noise performance due to larger PLL bandwidth that is required to maintain phase lock, and the chirp reset time is to be as short as possible in order to reduce the chirp period, thereby effecting better dynamic range of the radar system and lower power consumption (e.g., due to short data post processing). If the reset slope increases while PLL bandwidth is kept constant the phase difference (phase$_{ref}$–phase$_{div}$) during reset, as measured in the PFD will increase, where the dynamic range of PFD may be reached and cycle-slip may occur. This may limit the reduction of the reset time in a closed loop system. In the FIG. 2B, plots are used to represent these limitations where phase increase is seen as a function of the reset time. Represented phase is normalized to reference period, meaning that in this example dynamic range of the PFD (0.5) is reached, whereas reset time is reduced from 5 us to 2.5 us.

Figure 3:
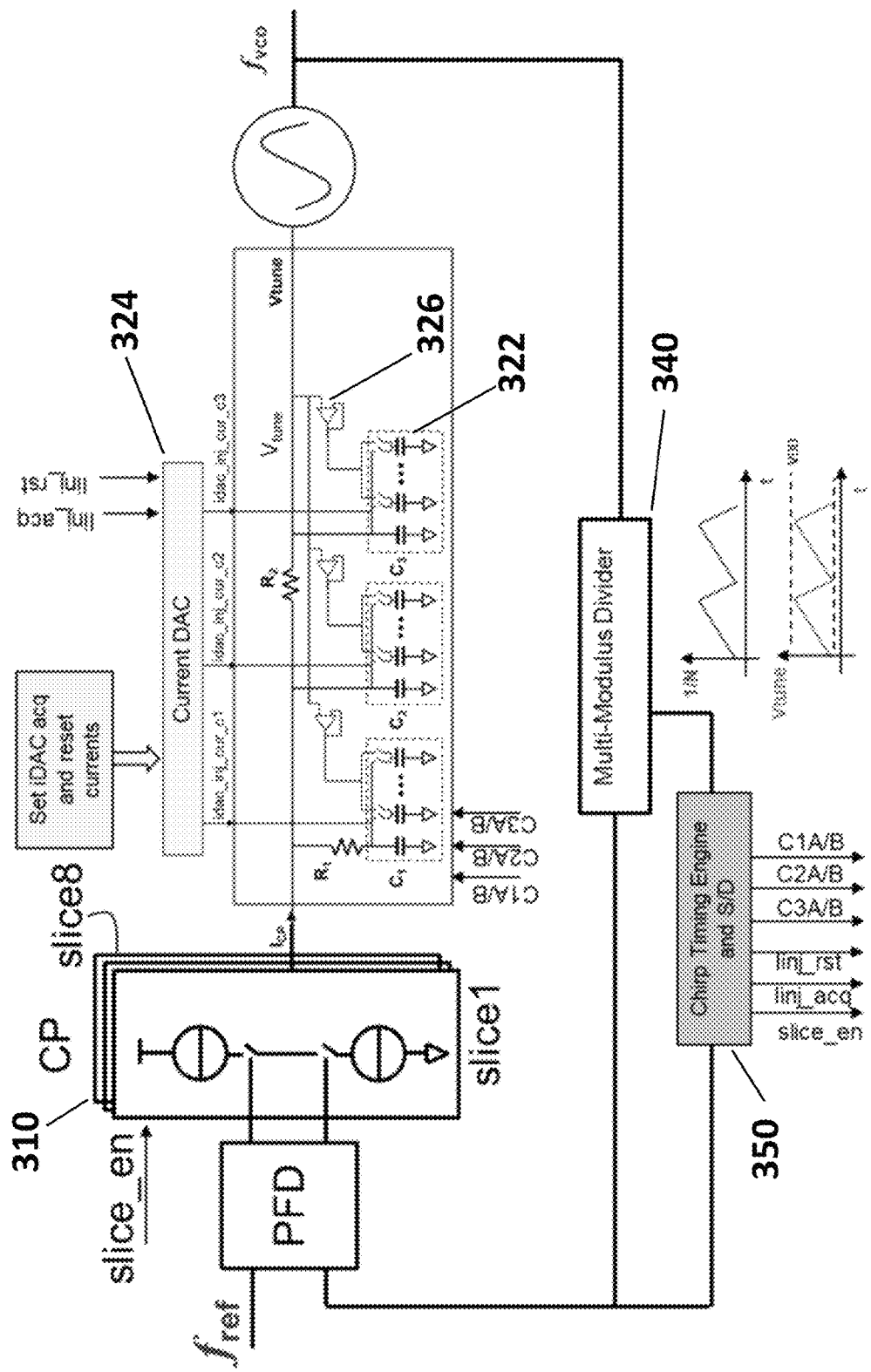
FIG. 3 is a more detailed circuit-based block diagram illustrating an example of PLL circuitry, in accordance with the present disclosure.

FIG. 3 shows a more detailed block diagram of the PLL system. The FMCW signal definition may be customer input, which may be translated to settings for the chirp timing Engine 350 that will effectively drive the Multi Modulus Divider 340. The chirp timing Engine 350 also controls the CP 310, the LPF capacitance 322 settings, and the injection DAC 324. This ensures proper synchronicity between the FMCW signal and the required dynamics for the LPF capacitance settings, as well as the injection DAC 324. Furthermore, the chirp timing engine 350 controlling these components may be designed such to introduce programmable delay that may be advance or delayed. This may make it possible to find an optimal timing and to account for possible delays between digital and analog system.

Continuing with FIG. 3; the CP 310 current is switched by means of slices, where a fixed factor is introduced (for example, a factor of 8). This allows for the CP to use one or more slices when injecting current (positive or negative) thereby allowing for a change in the slope in the $V_{tune}$ signal due to faster or slower charge of the LPF capacitors 322.

FIG. 3 also illustrates the LPF capacitors 322 configured in switchable banks. For example, each bank may be switchable to allow for 8 setting, or values of capacitance. Continuing with this example; the CP 310 current may increase by a factor up to 8 while capacitance may be reduced by factor of up to 8 so as to more rapidly change the value of $V_{tune}$. Also, for example, during the reset period, ⅛ of the capacitance will be part of the PLL loop (with high PLL bandwidth) while remaining the capacitance ⅞ will be charged by a buffer 326. Furthermore, high CP currents and low capacitance may be released only once PLL is settled, which occurs after the reset period (which reset period may be programmable). In this way it may ensure that ⅞ of the capacitance is only connected back to PLL loop once charge is equalized between ⅛ and ⅞ of capacitance.

Figure 4:
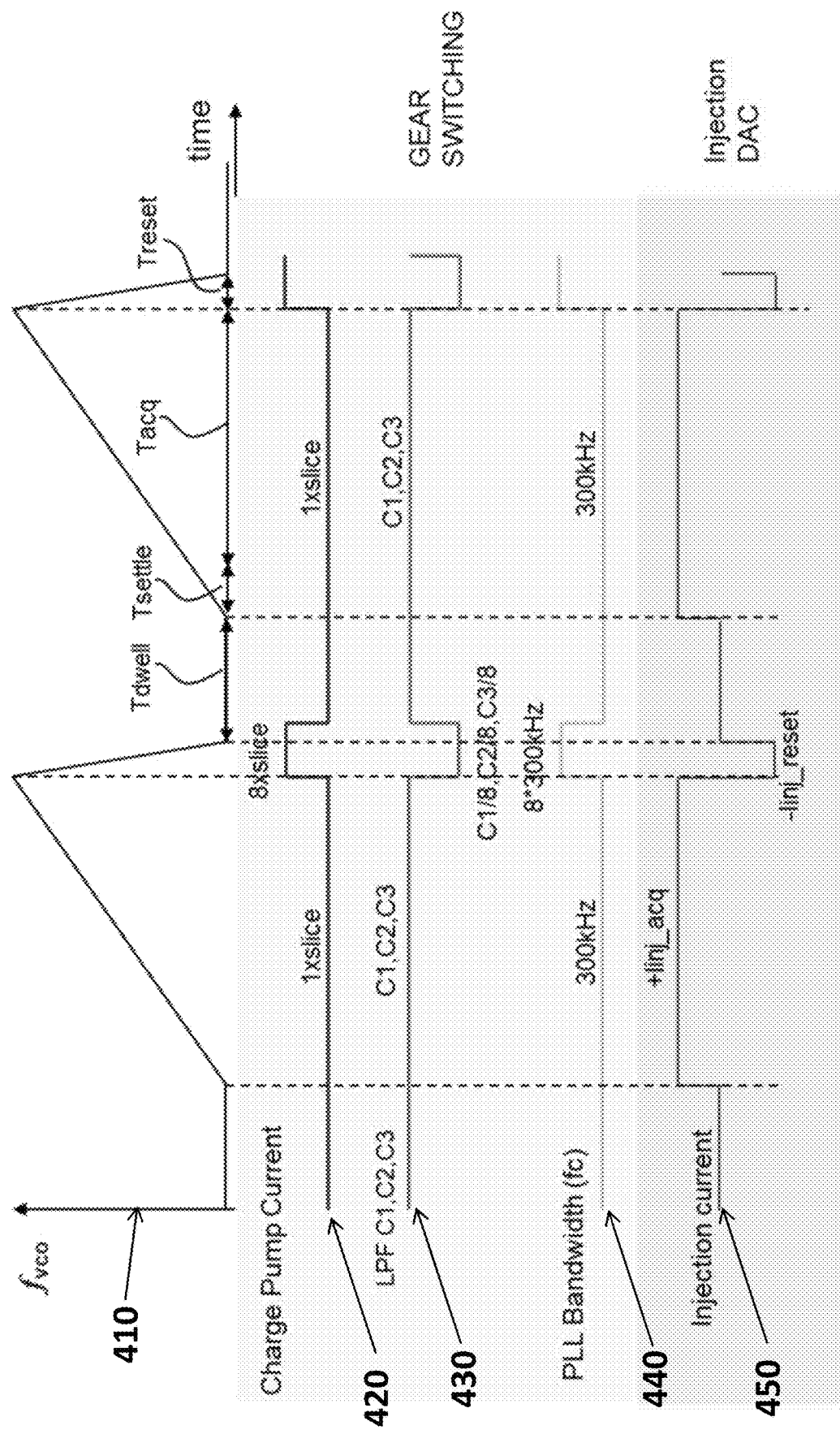
FIG. 4 is graph illustrating an example timing of operations within PLL circuitry, in accordance with the present disclosure.

FIG. 4 illustrates timing diagrams for the above example. In the signal timeline 410, that the chirp signal consists of a number of time divisions; $T_{well}$, $T_{settle}$, $T_{acq}$, and $T_{reset}$. Continuing with the previous example, the acquisition portion of the signal, defined by $T_{acq}$, is created by using one CP 310 slice and a complete bank of capacitors 322 (8 capacitors from each bank and referring aligned timelines 420 and 430). Also, the Injection DAC 324 is injecting positive current during $T_{acq}$. $T_{acq}$ is followed by $T_{reset}$. During $T_{reset}$, in this example, the CP 310 is illustrated using 8 slices to increase the current, thereby decreasing the time to perform the reset. Also, the Injection DAC 324 is injecting negative current during this time to further decrease the time to perform the reset. $T_{reset}$ is then followed by $T_{dwell}$ where the CP 310 transitions from 8 slices to 1 slice and the capacitor banks 322 transition from full banks (8 capacitors) to a single capacitor. Also, during this period, the injection DAC 324 does not inject current, thereby maintaining the signal level. Moving next to $T_{settle}$ and referring to the signal and injection DAC timelines 410 and 450, the injection DAC 324 returns to a positive current injection as seen in $T_{acq}$. The above set of time divisions are then repeated to form the FMCW signal.

In certain other examples, the present disclosure concerns transceiver circuitry that includes the signal generation circuit and the PLL circuit, and the transceiver circuitry to transmit the FMCW signaling and to receive and process reflections in response to the FMCW signaling being transmitted. The PLL circuit may include LPF circuitry that is capable of being dynamically adjusted. Such adjustments may permit a narrowing of the PLL BW during a PLL acquisition time ($T_{acq}$) and thereby mitigating noise in the received signal. Also, in the current example and as shown in the PLL bandwidth timeline 440 for the carrier frequency ($f_c$), the LPF circuitry may have a dynamically adjustable bandwidth permitting a widening of the PLL bandwidth during a reset allowing for a faster $T_{reset}$ time. High PLL bandwidth is maintained even after reset, and is switched to a low PLL bandwidth once the PLL has settled. This may result in optimal settling time. This PLL bandwidth adjustment may be affected by changing the variable capacitance of the PLL capacitive circuitry. Capacitance is switched to low during reset, which may reduce peak current requirements during reset. This reduced capacitance may result in reduced power requirements of the injection DAC as well a better efficiency.

In certain specific examples also relating to and useful with the above-described examples, a signal generating circuit to provide FMCW signaling in the form of chirps may including reset circuitry to reset at least a portion of the PLL circuit in preparation for the other PLL acquisition period.

In yet other specific examples, the FMCW signaling system described above may include a CP to apply current to the PLL capacitive circuitry during the PLL acquisition period so as to facilitate a PLL settling time. Also, such a CP may apply current to the PLL capacitive circuitry during the PLL acquisition period so as to realize chirp ramp linearity.

Consistent with the above aspects and in yet another detailed example, another important aspect of the instant disclosure includes a DAC. In respond to the analog-signal feedback path in the PLL circuit, the DAC may be provided with digital signals to control timing associated with the PLL BW, which is being dynamically changed. This change of BW is to ensure optimal settling time for the chirp and to reduce reset time. During the frequency ramp ($T_{settle}$ and $T_{acq}$), the injection DAC may provide the required current on each capacitor to create a voltage ramp. During the reset ramp ($T_{reset}$), the injection DAC may provide inverse current to ensure fast reset time.

In certain more specific examples, the PLL circuit may include a PFD which detects phase and/or frequency differences, in the signal generated by the PLL circuit relative to a supplied reference frequency. Further the PLL circuit may include CP circuitry controlled, in part by the PFD, so as to inject current into other circuitry coupled to the PLL. This may include low-pass filter capacitors. As a specific example, in one implementation a logic circuit in the CP circuitry is used to detect when the CP current changes polarity (e.g., from acquisition to reset, positive-to-negative chirp slope).

In yet another specific example, the PLL circuitry of the FMCW signaling system may further include BW control circuitry, CP and LPF circuitry. The BW control circuitry may provide signals to control settings for the PLL BW by adjusting the CP circuitry and/or the LPF circuitry, as discussed previously.

In certain other examples BW control circuitry may include, but not limited to, DAC(s), CP circuitry, and LPF circuitry. The DAC circuitry may respond to, in part, the analog-signal feedback path in the PLL circuit. Further, this BW control circuitry, in combination with a chirp timing engine, may provide control signals for setting for the DAC(s), CP circuitry, and LPF circuitry. Circuits associated with adjusting bandwidth may provide control signals for changing the PLL acquisition timing and the variable capacitance which may be used by the DAC, the CP circuitry, the LPF circuitry.

In yet other specific examples related to the above aspects, the present disclosure is directed to circuitry to provide course capacitance settings for the PLL circuit. Also, circuitry may be provided to control signals, for controlling $V_{tune}$, so as to obtain less course capacitance adjustments for the PLL circuit. The BW of the PLL may therefore be controlled by using the generated $V_{tune}$ control signal to adjust one or more loop dynamic parameters of the PLL. These dynamic parameters may be adjusted due to changes in one or more LPFs. The above $V_{tune}$ control signal may also be used to adjust a voltage-controlled oscillator (VCO) to generate a range of frequencies.

In yet another detailed example, another important aspect of the instant disclosure includes a multi-modulus divider as part of the PLL circuitry. The multi-modulus divider divides down the frequency of the generated output signal ($f_{chip}$), via a given division ratio, for comparison to a reference frequency signal ($f_{ref}$). This allows for the PFD to compare the frequency and phase of the generated signal (divided by the division ratio) to the reference signal ($f_{ref}$). This then allows for the PFD to adjust CP signaling thereby correcting the frequency and phase of the generated signal ($f_{chip}$).

In yet another example, the FMCW signaling system may further include a chirp-timing circuitry (which may also include source and/or drain circuitry). Such circuitry may be used to control parameters for the chirp-timing circuitry. These parameters may include three or more of the following: chirp rate, frequency range, reset time (Treset), dwell time (Tdwell), and settling time (Tsettle).

In one specific example, the FMCW signaling system may further include chirp-timing circuitry and capacitive tuning circuitry associated with the PLL. Capacitive tuning may be accomplished using at least one DAC to inject current, of one polarity, into the LPF circuitry, as needed, during the chirp ramp time associated with the chirp timing circuitry. Also, at least one DAC may inject current, of an opposite polarity, into the LPF circuitry, as needed, to decrease the reset time associated with the chirp timing circuitry.

In some embodiments, a PLL system may include a CP and chirp-timing circuitry to provide timing-related control signals. Further, the system may include at least one LPF circuit which may include one or more capacitors to be switched to allow decreasing and/or increasing BW of the LPF circuit. Switching of capacitors may be controlled via timing-related control signals. Also, to reduce the reset time interval, the CP may inject current at reset time, into one or more capacitors associated with the LPF.

In specific examples according to the present disclosure, embodiments involve a method which may include generating FMCW signaling in the form of chirps. Also, the method includes varying the BW in a PLL using variable capacitance controlled by the PLL control circuitry. The dynamically changing BW is used during the PLL acquisition time to control the chirp slope. The variable capacitance of the PLL may also be changed, and therefore the BW changed, in preparation for another PLL acquisition period of another frequency sweep.

Terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

As examples, the Specification describes and/or illustrates aspects useful for implementing the claimed disclosure by way of various circuits or circuitry which may be illustrated as or using terms such as blocks, modules, device, system, unit, controller, and/or other circuit-type depictions (e.g., reference numerals 120 and 210 of FIGS. 1 and 2 depict a block/module as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches shown in connection with certain of example logic circuits such as the circuit blocks of FIGS. 1, 2 and 4. In certain embodiments, such a logic/programmable circuit refers to or includes one or more computer circuits (which may be included memory circuitry for storing and accessing a program to be executed as a set (or sets) of instructions) and may also include configuration data to define how the logic/programmable circuit is to perform. In such context, an algorithm or process as described above is used by the logic/programmable circuit to perform the related steps, functions, operations, activities, etc. Depending on the application, the instructions and/or configuration data can be configured for implementation in logic circuitry, with the instructions (whether characterized in the form of object code, firmware or software) stored in and accessible from a memory (circuit).

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. Such modifications do not depart from the true spirit and scope of various aspects of the disclosure, including aspects set forth in the claims

What is claimed is:

1. A system comprising:
   a signal generation circuit to provide FMCW (frequency modulated continuous wave) signaling in the form of frequency sweeps involving chirps; and
   a phase lock loop (PLL) circuit having a variable PLL bandwidth (BW) and having PLL capacitive circuitry for providing variable capacitance in the PLL circuit, wherein the PLL BW is dynamically changed in that during a PLL acquisition period the PLL circuit controls the variable PLL BW to correspond to at least one chirp slope respectively associated with said at least one of the chirps and in that during another period associated with times between each of the frequency sweeps, the variable capacitance of the PLL capacitive circuitry is changed in preparation for another PLL acquisition period associated with another the frequency sweeps.

2. The system of claim 1, wherein the PLL BW is dynamically controlled, via use of the PLL capacitive circuitry, to mitigate against phase noise adversely affecting the PLL circuit.

3. The system of claim 1, further including a charge pump to apply current to the PLL capacitive circuitry during a PLL acquisition period, wherein the applied current corresponds to the slope.

4. The system of claim 1, wherein variable capacitance of the PLL capacitive circuitry is reduced in preparation for the other PLL acquisition period during, or associated with, a PLL reset time.

5. The system of claim 1, further including transceiver circuitry that includes the signal generation circuit and the phase lock loop (PLL) circuit, the transceiver circuitry to transmit the FMCW signaling and to receiving and process reflections in response to the FMCW signaling being transmit, wherein the PLL circuit includes lowpass filter (LPF) circuitry to be dynamically adjusted for permitting a narrowing of the PLL BW during a PLL acquisition time (Tacq) while mitigating noise, and wherein the LPF circuitry has a bandwidth to be dynamically adjusted for permitting a widening of the PLL bandwidth during a reset period effected by changing the variable capacitance of the PLL capacitive circuitry.

6. The system of claim 1, further including reset circuitry to reset at least a portion of the PLL circuit in preparation for the other PLL acquisition period.

7. The system of claim 1, further including a charge pump to apply current to the PLL capacitive circuitry during a period in which the PLL is in acquisition and/or is settling, wherein the applied current is to facilitate a PLL settling time.

8. The system of claim 1, further including a charge pump to apply current to the PLL capacitive circuitry during the PLL acquisition period, wherein the current is to be applied during acquisition and to realize chirp ramp linearity.

9. The system of claim 1, further including a charge pump to apply current to the PLL capacitive circuitry.

10. The system of claim 1, further including a digital-to-analog converter, responsive to an analog-signal feedback path in the PLL circuit, configured to provide digital signals to control timing associated with the PLL BW being dynamically changed.

11. The system of claim 1, wherein the PLL circuit includes a phase/frequency detector (PFD) which detects phase and/or frequency differences, signal relative to a reference frequency, in a signal generated by the PLL circuit; and further including charge pump circuitry controlled, in part by the PFD, so as to inject current into other circuitry coupled to the PLL circuit.

12. The system of claim 1, further including BW control circuitry, charge pump circuitry and low-pass-filter circuitry, wherein the BW control circuitry is to provide control signals for the PLL BW via settings for the charge pump circuitry and the low-pass-filter circuitry.

13. The system of claim 1, further including: BW control circuitry; a digital-to-analog converter responsive to an analog-signal feedback path in the PLL circuit; charge pump circuitry; and low-pass-filter circuitry; wherein the BW control circuitry is to provide control signals for settings, associated with PLL acquisition timing and timing for changing the variable capacitance, used by: the digital-to-analog converter, the charge pump circuitry, and the low-pass-filter circuitry.

14. The system of claim 1, further including circuitry to provide course capacitance settings for the PLL circuit and to provide a tuning control signal for less course capacitance settings for the PLL circuit, and further including one or more low-pass filters to control at least one loop dynamic parameter of the PLL.

15. The system of claim 1, further including circuitry to a generate a tuning control signal, and further including a voltage-controlled oscillator (VCO), responsive to the tuning control signal, to generate a range of frequencies.

16. A system of claim 1, the PLL circuit further including a multi-modulus divider to provide dividing-down mixing, via a division ratio, wherein the PLL is to generate an output signal at a frequency responsive to a comparison with a reference frequency signal.

17. A system of claim 1, further including a chirp-timing circuitry to provide control for parameters associated with the chirp-timing circuitry, the parameters including three or more of the following: chirp rate, frequency range, reset time, dwell time, and settling time.

18. A system of claim 1, further including a chirp-timing circuitry and capacitive tuning circuitry, wherein the PLL circuit includes low-pass-filter (LPF) circuitry and at least one digital-to analog converter (DAC) configured to inject current into the LPF circuitry, wherein said at least one DAC is to inject current of one polarity during a chirping ramp time associated with the chirp-timing circuitry and is to inject current of an opposite polarity to decrease a reset time associated with the chirp-timing circuitry.

19. A system of claim 1, further including a charge pump and a chirp-timing circuitry to provide timing-related control signals, and wherein the PLL includes at least one LPF circuit, each said at least one LPF circuit including one or more capacitors for providing filter capacitance as part of the PLL circuit, and each said at least one LPF circuit to be switched for decreasing and/or increasing BW of the LPF circuit via the timing-related control signals, wherein the charge pump is to inject current during reset time for reducing a reset time interval associated with the chirp-timing circuitry.

20. A method comprising:
generating FMCW (frequency modulated continuous wave) signaling in the form of frequency sweeps (chirps); and
in a phase lock loop (PLL) circuit, varying a PLL bandwidth (BW) via PLL capacitive circuitry via variable capacitance within the PLL circuit, including dynamically changing the PLL BW in that during a PLL acquisition period the PLL circuit controls the variable PLL BW to correspond to at least one chirp slope respectively associated with said at least one of the chirps and in that during another period associated with times between each of the frequency sweeps, the variable capacitance of the PLL capacitive circuitry is changed in preparation for another PLL acquisition period associated with another the frequency sweeps.

* * * * *